(12) United States Patent
Kawase et al.

(10) Patent No.: US 9,362,219 B2
(45) Date of Patent: Jun. 7, 2016

(54) SEMICONDUCTOR MODULE AND SEMICONDUCTOR DEVICE

(71) Applicant: Mitsubishi Electric Corporation, Tokyo (JP)

(72) Inventors: Tatsuya Kawase, Tokyo (JP); Mikio Ishihara, Tokyo (JP); Noboru Miyamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/787,103

(22) PCT Filed: May 9, 2013

(86) PCT No.: PCT/JP2013/063053
§ 371 (c)(1),
(2) Date: Oct. 26, 2015

(87) PCT Pub. No.: WO2014/181426
PCT Pub. Date: Nov. 13, 2014

(65) Prior Publication Data
US 2016/0079155 A1    Mar. 17, 2016

(51) Int. Cl.
*H01L 23/34* (2006.01)
*H01L 23/498* (2006.01)
(Continued)

(52) U.S. Cl.
CPC ...... *H01L 23/49844* (2013.01); *H01L 21/4871* (2013.01); *H01L 23/053* (2013.01);
(Continued)

(58) Field of Classification Search
CPC .............. H01L 23/3672; H01L 23/473; H01L 23/3677; H01L 23/4006; H01L 2023/4087
USPC .................... 257/707, 706, 714, 718, 719, 78
See application file for complete search history.

(56) References Cited

U.S. PATENT DOCUMENTS 5,705,850 A * 1/1998 Ashiwake ........... H01L 23/4338
257/706
6,212,074 B1 * 4/2001 Gonsalves .......... H01L 23/4006
165/185
(Continued)

FOREIGN PATENT DOCUMENTS

JP    2002-158322 A    5/2002
JP    2002-315357 A    10/2002
(Continued)

OTHER PUBLICATIONS

International Search Report issued in Application No. PCT/JP2013/063053, mailed Jul. 9, 2013.
(Continued)

*Primary Examiner* — Sheila V. Clark
(74) *Attorney, Agent, or Firm* — Studebaker & Brackett PC

(57) ABSTRACT

A heat sink has a fixation surface and a heat release surface opposite from the fixation surface. A fin is provided in a central portion of the heat release surface. An insulating member is provided on the fixation surface of the heat sink. An electroconductive member is provided on the insulating member. A semiconductor chip is provided on the electroconductive member. A metal frame is connected to the semiconductor chip. A molding resin covers the heat sink, the insulating member, the electroconductive member, the semiconductor chip, and the metal frame so that the fin is exposed to outside. A hole extends through a peripheral portion of the heat sink and a peripheral portion of the molding resin. The semiconductor module is mounted on a cooling jacket by passing a screw through the hole.

20 Claims, 14 Drawing Sheets

(51) Int. Cl.
*H01L 23/473* (2006.01)
*H01L 23/31* (2006.01)
*H01L 25/07* (2006.01)
*H01L 23/373* (2006.01)
*H01L 21/48* (2006.01)
*H01L 23/053* (2006.01)
*H01L 23/367* (2006.01)
*H01L 23/00* (2006.01)
*H01L 23/40* (2006.01)

(52) U.S. Cl.
CPC ........ *H01L23/3107* (2013.01); *H01L 23/3677* (2013.01); *H01L 23/3735* (2013.01); *H01L 23/3736* (2013.01); *H01L 23/473* (2013.01); *H01L 25/072* (2013.01); *H01L 23/4006* (2013.01); *H01L 24/40* (2013.01); *H01L 2224/291* (2013.01); *H01L 2224/32225* (2013.01); *H01L 2224/32245* (2013.01); *H01L 2224/33181* (2013.01); *H01L 2224/37124* (2013.01); *H01L 2224/40137* (2013.01); *H01L 2224/40247* (2013.01); *H01L 2224/41175* (2013.01); *H01L 2224/73263* (2013.01); *H01L 2924/181* (2013.01)

(56) References Cited

U.S. PATENT DOCUMENTS 7,388,746 B2 * 6/2008 Park .................. H01L 23/4006
 165/80.4

2007/0256810 A1 * 11/2007 Di Stefano ............ H01L 23/473
 165/46
2008/0237847 A1 10/2008 Nakanishi et al.
2011/0304039 A1 12/2011 Miyamoto
2012/0181679 A1 7/2012 Kadoguchi et al.
2015/0097281 A1 * 4/2015 Adachi ................. H01L 23/473
 257/714

FOREIGN PATENT DOCUMENTS

| | | | |
|---|---|---|---|
| JP | 2002-315358 | A | 10/2002 |
| JP | 2004-172378 | A | 6/2004 |
| JP | 2007-184315 | A | 7/2007 |
| JP | 2008-198644 | A | 8/2008 |
| JP | 2008-311550 | A | 12/2008 |
| JP | 2009-188176 | A | 8/2009 |
| JP | 2012-004218 | A | 1/2012 |
| JP | 2012-028561 | A | 2/2012 |
| JP | 2012-079950 | A | 4/2012 |
| JP | 2012-084708 | A | 4/2012 |
| JP | 2012-146919 | A | 8/2012 |
| JP | 2013-030649 | A | 2/2013 |

OTHER PUBLICATIONS

Translation of the International Preliminary Report on Patentability issued in Application No. PCT/JP2013/063053, mailed Nov. 19, 2015.

* cited by examiner

SEMICONDUCTOR MODULE AND SEMICONDUCTOR DEVICE

TECHNICAL FIELD

The present invention relates to a semiconductor module and a semiconductor device used, for example, for control of a motor mounted on a vehicle.

BACKGROUND ART

Conventionally, a semiconductor module has been attached to a heat sink by interposing grease therebetween in order to achieve improvements in bondability and heat releasability. In such a case, the semiconductor module is attached to the heat sink by using a pressing plate and screws in order to achieve warpage inhibition and to ensure intimate contact with grease. For example, a technique to fix a semiconductor module by providing a through hole in a central portion of a semiconductor module, passing a screw through the through hole and pressing the semiconductor module with a dish spring plate (see Patent Literature 1).

A heat sink is ordinarily attached to a cooling jacket by using screws. For example, a semiconductor module has been disclosed in which an insulating substrate is soldered to a heat sink; a semiconductor chip is fixed on the insulating substrate; and a case is bonded to a peripheral portion of the heat sink (see Patent Literature 2).

CITATION LIST

Patent Literature

Patent Literature 1: Japanese Patent Laid-Open No. 2008-198644
Patent Literature 2: Japanese Patent Laid-Open No. 2009-188176

SUMMARY OF INVENTION

Technical Problem

However, there has been a problem that the heat conductivity of grease is low, resulting in unsatisfactory heat releasability. Also, dissipating heat with stability requires fixing a semiconductor module on a heat sink while correcting a warp of the semiconductor module, resulting in an increased number of component parts. The technique disclosed in Patent Literature 1 requires providing a through hole in a central portion of a semiconductor module, resulting in a reduction in degree of freedom of layout in the module.

If an insulating substrate and a heat sink are combined integrally with each other as disclosed in Patent Literature 2, the need for grease is eliminated. In such a case, however, the overall size is increased because a resin case is fixed to the heat sink with a bonding agent. Further, because of use of a soft gel in the case, the module is deformed and broken unless a measure such as increasing the thickness of the heat sink or using a material having a high strength (e.g., Cu) for the heat sink is taken.

The present invention has been achieved to solve the above-described problems, and an object of the present invention is to provide a semiconductor module and a semiconductor device capable of securing heat releasability, improving the degree of freedom of layout in a module and inhibiting deformation and breakage of the module.

Means for Solving the Problems

A semiconductor module according to the present invention includes: a heat sink having a fixation surface and a heat release surface opposite from the fixation surface; a fin provided in a central portion of the heat release surface; an insulating member provided on the fixation surface of the heat sink; an electroconductive member provided on the insulating member; a semiconductor chip provided on the electroconductive member; a metal frame connected to the semiconductor chip; and a molding resin covering the heat sink, the insulating member, the electroconductive member, the semiconductor chip, and the metal frame so that the fin is exposed to outside, wherein a hole extends through a peripheral portion of the heat sink and a peripheral portion of the molding resin, and the semiconductor module is mounted on a cooling jacket by passing a screw through the hole.

Advantageous Effects of Invention

The present invention makes it possible to secure heat releasability, improve the degree of freedom of layout in a module and inhibit deformation and breakage of the module.

DESCRIPTION OF EMBODIMENTS

A semiconductor module according to the embodiments of the present invention will be described with reference to the drawings. The same components will be denoted by the same symbols, and the repeated description thereof may be omitted.

Embodiment 1

Figure 1:
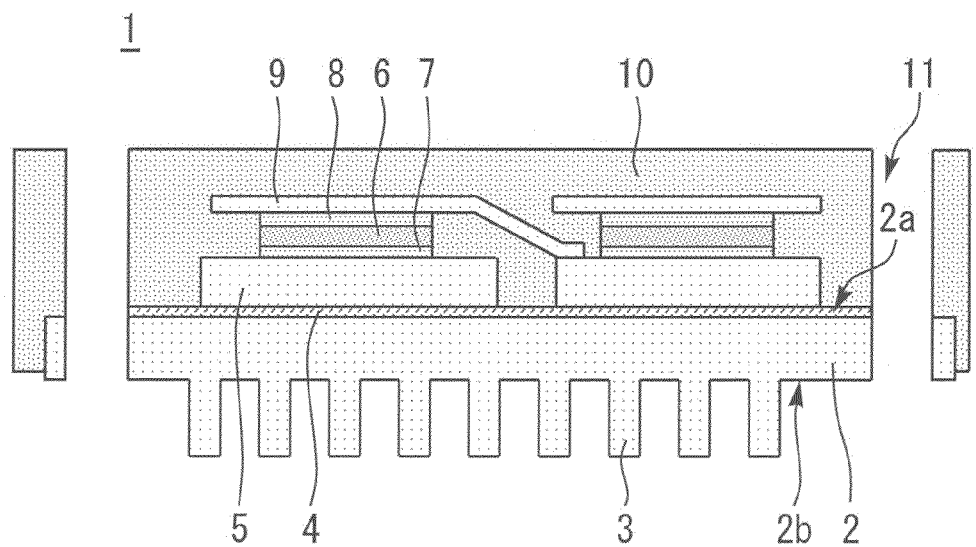
FIG. 1 is a sectional view of a semiconductor module according to Embodiment 1 of the present invention.

FIG. 1 is a sectional view of a semiconductor module according to Embodiment 1 of the present invention. A semiconductor module 1 has a heat sink 2 having a size of about 80 mm×80 mm and a thickness of about 3 mm and made of Al or Cu. The heat sink 2 has a fixation surface 2a (upper surface) and a heat release surface 2b (lower surface) opposite from the fixation surface 2a. Fins 3 are provided in a central portion of the heat release surface 2b.

An insulating member 4 is provided on the fixation surface 2a of the heat sink 2, with no brazing filler metal such as solder interposed therebetween. The insulating member 4 is an insulating substrate made of AlN or $Si_3N_4$ for example. It is desirable to minimize the thickness of the insulating member 4 for the purpose of reducing the thermal resistance. The thickness of the insulating member 4 is, for example, 0.635 mm.

An electroconductive member 5 in the form of a metal pattern is provided on the insulating member 4 in the form of an insulating substrate. This thickness of the electroconductive member 5 is set to 1 to 1.5 times that of the heat sink 2. However, it is desirable to set the thickness of the insulating member 4 smaller than that of the electroconductive member 5 and heat sink 2 in order to improve heat releasability.

A semiconductor chip 6 is provided on the electroconductive member 5, and a lower surface electrode of the semiconductor chip 6 is joined to the electroconductive member 5 by means of an electroconductive joining material 7 such as solder. A metal frame 9 is connected to an upper surface electrode of the semiconductor chip 6 by means of an electroconductive joining material 8 such as solder.

A molding resin 10 covers the heat sink 2, the insulating member 4, the electroconductive member 5, the semiconductor chip 6, the electroconductive joining materials 7 and 8 and the metal frame 9 so that the fins 3 are exposed to outside. A hole 11 is provided which extends through a peripheral portion of the heat sink 2 and a peripheral portion of the molding resin 10. In the present embodiment, the height of the upper surface of the molding resin 10 is constant.

Figure 2:
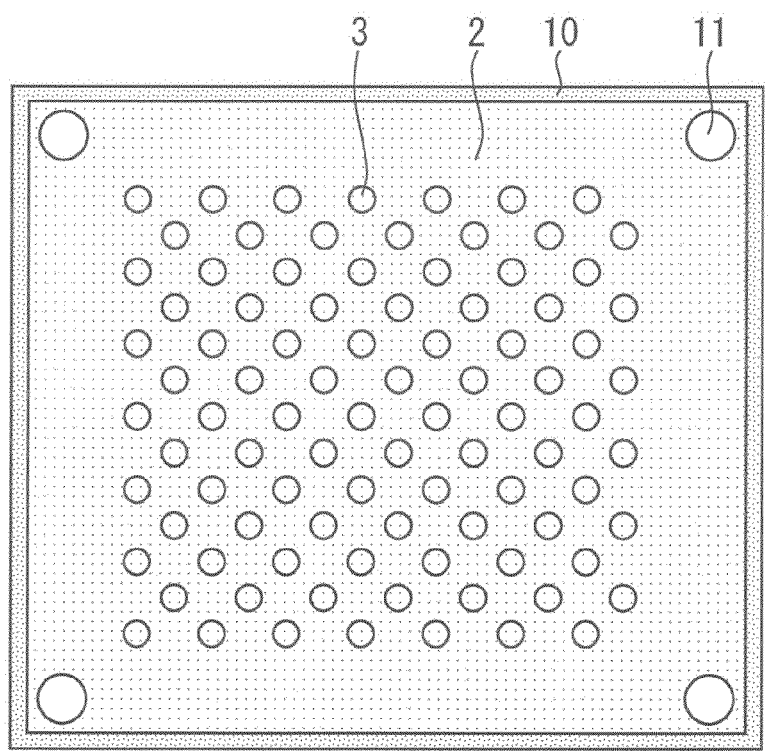
FIG. 2 is a diagram showing the heat release surface of the heat sink of the semiconductor module shown in FIG. 1.

FIG. 2 is a diagram showing the heat release surface of the heat sink of the semiconductor module shown in FIG. 1. The fins 3 are provided on the central portion of the heat release surface 2b. The peripheral portion of the heat sink 2 is a sealed portion sealed with the molding resin 10. The hole 11 is formed in this sealed portion. The material of the heat sink 2 and the material of the fins 3 may be the same or different from each other. For example, a material having heat conductivity higher than that of the heat sink 2 may be used as the material of the fins 3.

Figure 3:
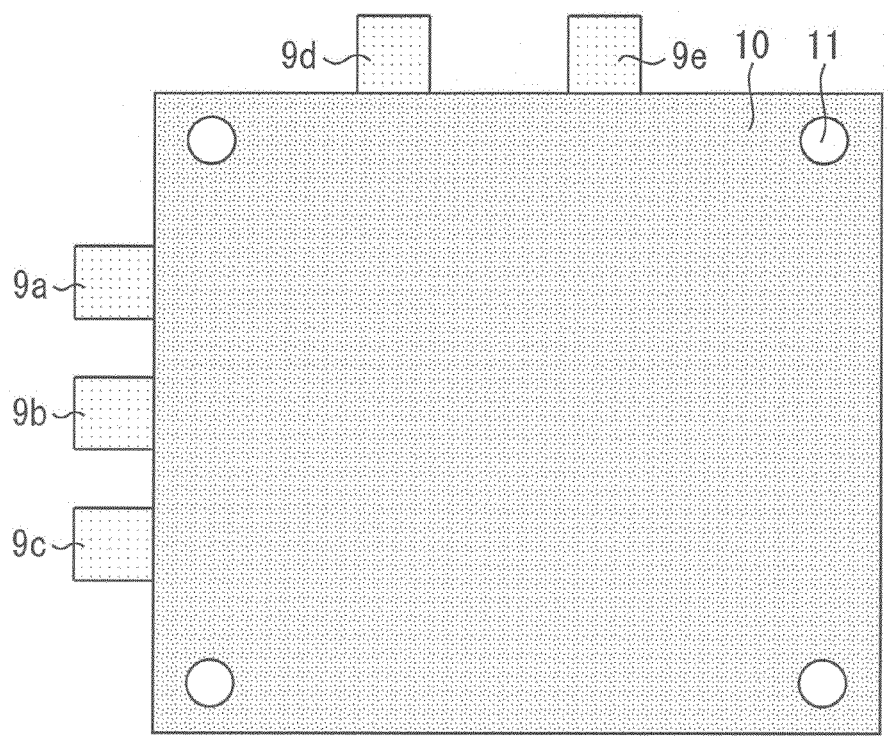
FIGS. 3, 4, and 5 are a top view, an internal view and a circuit diagram of the semiconductor module according to Embodiment 1 of the present invention.
Figure 4:
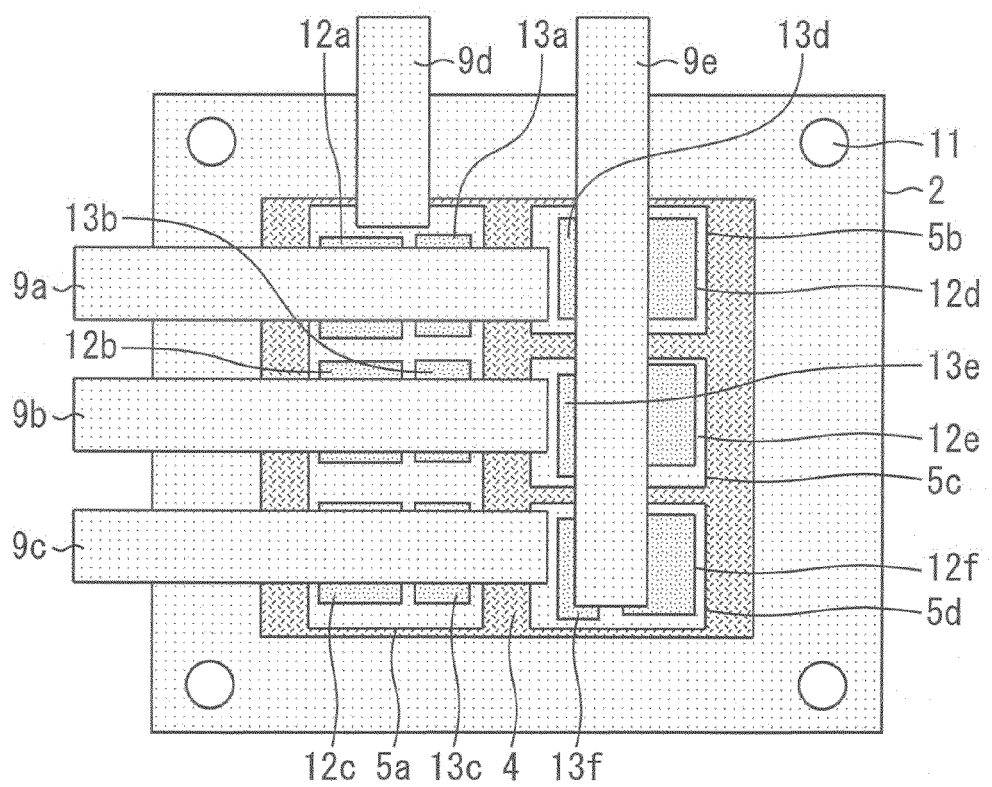
Figure 5:
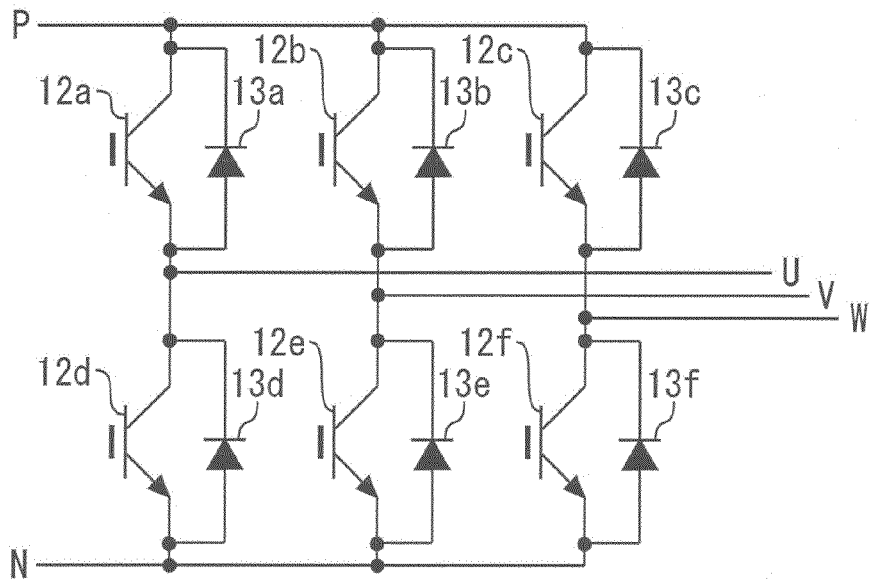

FIGS. 3, 4, and 5 are a top view, an internal view and a circuit diagram of the semiconductor module according to Embodiment 1 of the present invention. In the internal view, the molding resin 10 is omitted. The semiconductor module is of a 6-in-1 structure, i.e., a structure in which six switching elements are mounted in one module.

Each of IGBTs 12a to 12f and forward diodes 13a to 13f corresponds to the semiconductor chip 6 shown in FIG. 1. Metal frames 9a to 9e correspond to a U electrode, a V electrode, a W electrode, a P electrode and an N electrode, respectively.

Lower surfaces of the IGBTs 12a to 12c and the forward diodes 13a to 13c are connected to an electroconductive member 5a. Lower surfaces of the IGBTs 12d to 12f and the forward diodes 13d to 13f are connected to electroconductive members 5b to 5d. The metal frames 9a to 9s are respectively connected to upper surfaces of the IGBTs 12a to 12c and the forward diodes 13a to 13c and to the electroconductive members 5b to 5d. The metal frame 9d is connected to the electroconductive member 5a. The metal frame 9e is connected to the upper surfaces of the IGBTs 12d to 12f and the forward diodes 13d to 13f.

Figure 6:
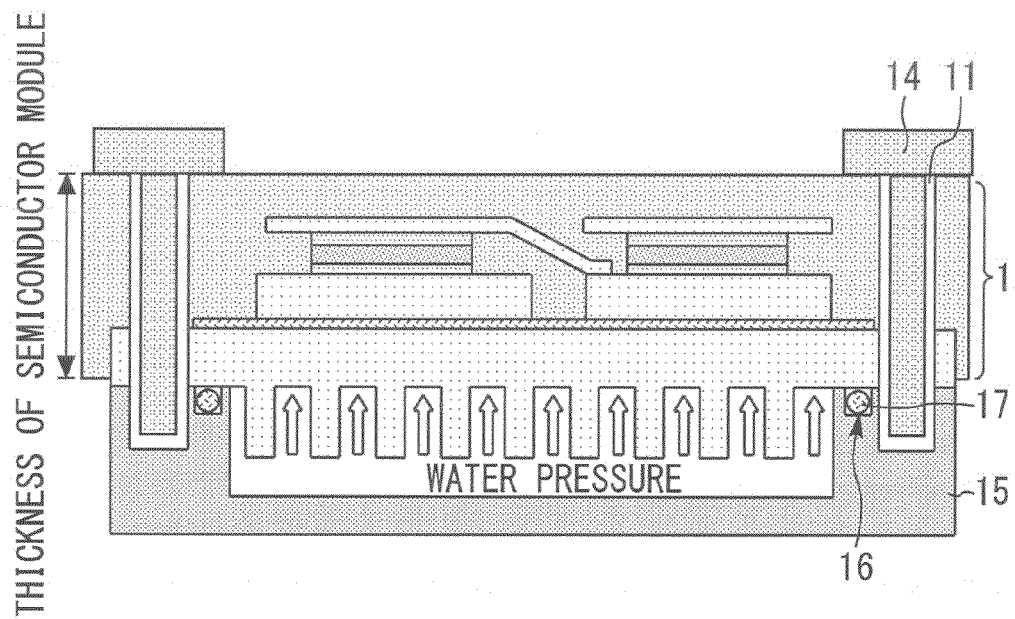
FIG. 6 is a sectional view showing a state where the semiconductor module shown in FIG. 1 is fixed on a cooling jacket which is a passage for a cooling medium.

FIG. 6 is a sectional view showing a state where the semiconductor module shown in FIG. 1 is fixed on a cooling jacket which is a passage for a cooling medium. The semiconductor module 1 is mounted on the cooling jacket 15 by passing screws 14 through the holes 11 of the semiconductor module 1 and by inserting the screws 14 in the threaded holes in the cooling jacket 15. A sealing member 17 such as an O-ring is disposed in a groove 16 in the cooling jacket 15.

Figure 7:
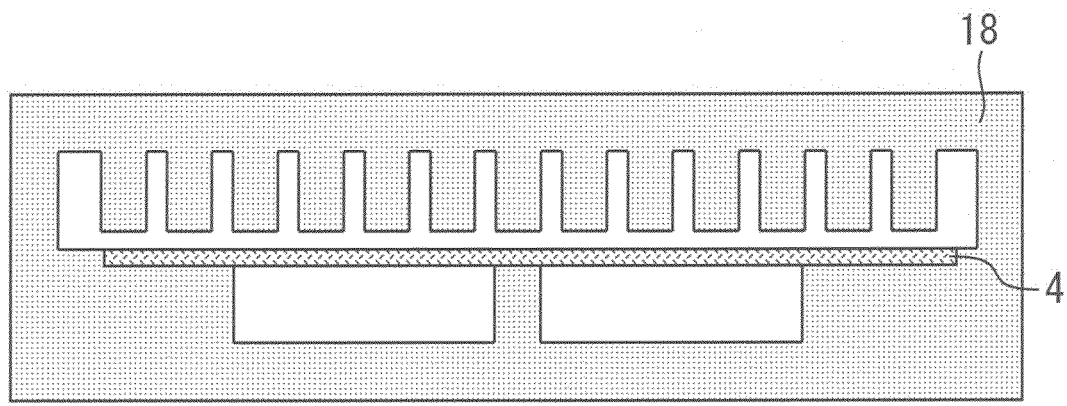
FIG. 7 is a sectional view showing a method of manufacturing the metal pattern and the heat sink of the semiconductor module shown in FIG. 1.
Figure 7:
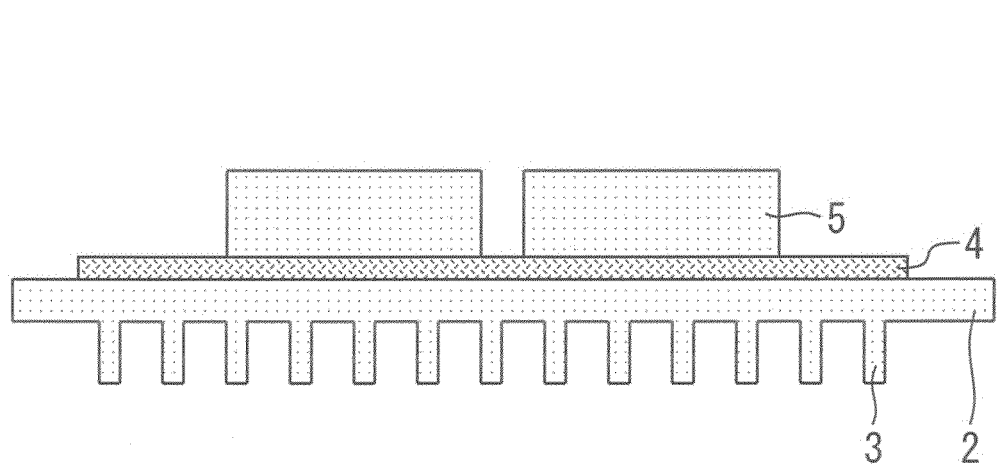

FIG. 7 is a sectional view showing a method of manufacturing the metal pattern and the heat sink of the semiconductor module shown in FIG. 1. In the case where the material of the electroconductive members 5 and the material of the heat sink 2 are the same, the electroconductive members 5 and the heat sink 2 can be manufactured integrally with each other by flowing a molten metal into the a mold 18 while the insulating member 4 is held in the mold 18. At this time, the ratio of the thicknesses of the electroconductive members 5 and the heat sink 2 can be freely changed by setting the position of the insulating member 4 according to one's need. A material different from the material of the heat sink 2 may be used as the material of the electroconductive members 5. In such a case, different molds are used in separate steps with respect to the upper surface and the lower surface of the insulating member 4, and the metal is flowed into each mold.

In the present embodiment, as described above, the semiconductor chip 6 and the heat sink 2 are fixed by being sealed with the molding resin 10, thereby eliminating the need for screws to be used to fix the semiconductor chip 6 and the heat sink 2 and members to be interposed including a plate member for inhibiting warpage of the module and grease, and enabling reducing the number of component parts.

Since there is no need to interpose grease between the semiconductor chip 6 and the heat sink 2, heat releasability can be secured. Heat generated by energization of the semiconductor chip 6 can therefore be dissipated effectively.

Since the mount holes 11 are provided in the peripheral portion of the module, the degree of freedom of layout in the module can be improved. Because no holes 11 are formed at a center of the semiconductor module 1, six or more switching elements can be disposed and a three-phase inverter capable of driving a motor can therefore be realized in one semiconductor module.

Since the heat sink 2 including portions on the periphery of the holes 11 as screw-fastened portions on which stress tends to concentrate is sealed with the molding resin 10, the strength of the entire module can be increased to inhibit deformation and breakage of the module.

Since the heat sink 2 and the insulating member 4 are directly joined to each other, the heat releasability is improved in comparison with the structure in which the heat sink 2 and the insulating member 4 are joined to each other by means of an electroconductive joining material. Further, since there is no risk of occurrence of a crack in an electroconductive joining material or the like, the heat-cycle or power-cycle life is improved. The assembly cost can be reduced since the step of joining by means of a joining material can also be removed.

If an insulating substrate having a high resistive strength is used as insulating member 4, the strength of the semiconductor module is improved. It is preferable that the insulating substrate be made of a ceramic material in particular. The heat releasability of the semiconductor module can be improved since the ceramic material has high heat conductivity.

The fixation surface 2a may be coated with a resin in sheet form such as an epoxy material, which is provided as insulating member 4 in place of the insulating substrate. Because the resin in sheet form is flexible, the possibility of brittle fracture of the insulating member 4 is reduced and the power-cycle or heat-cycle life is improved. Also, because the insulating sheet is thinner than the insulating substrate, the thickness of the entire semiconductor module can also be reduced. A heat spreader such as Cu is provided as electroconductive member 5 on the insulating sheet, and the semiconductor chip 6 is mounted on the heat spreader. Heat generated from the semiconductor chip 6 can be effectively diffused by the heat spreader. The increase in temperature of the entire semiconductor module can thereby be limited.

In the case where the electroconductive member 5 and the semiconductor chip 6 are joined to each other by means of the electroconductive joining material 7, it is preferable that a plating treatment be performed on the region of the surface of the electroconductive member 5 on which the semiconductor chip 6 is to be mounted. The wettability of the electroconductive joining material 7 between the electroconductive member 5 and the semiconductor chip 6 is improved by performing the plating treatment.

It is preferable that the material of the heat sink 2 and the material of the electroconductive member 5 be the same. In the case where the material of the heat sink 2 and the material of the electroconductive member 5 are the same, they can be formed simultaneously with each other, for example, by a method using a molten metal and the number of manufacturing steps can therefore be reduced. Al or an Al alloy in particular is preferred as the material of the heat sink 2 and the electroconductive member 5. Al or the Al alloy is light in weight and enables the entire semiconductor module to be reduced in weight.

Figure 8:
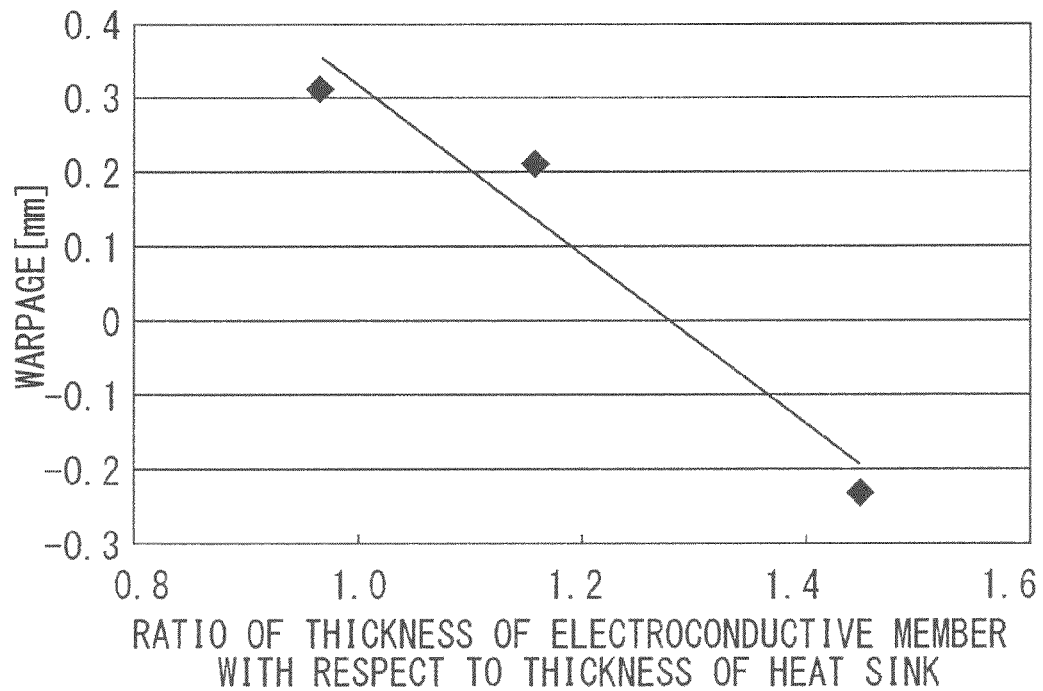
FIG. 8 is a diagram showing results of a simulation and analysis of the warpage of the heat sink caused by heating while the ratio of the thickness of the electroconductive member is changed with respect to the thickness of the heat sink.

FIG. 8 is a diagram showing results of a simulation and analysis of the warpage of the heat sink caused by heating while the ratio of the thickness of the electroconductive member is changed with respect to the thickness of the heat sink. Heating from 25° C. to 250° C. was performed. Each of the heat sink 2, the fins 3 and the electroconductive member 5 was Al. The insulating member 4 had an AlN plate having a thickness of 0.635 mm. Positive warpage values on the vertical axis correspond to warpage convexity toward the fin side of the heat sink.

Warpage due to heat entails an assembly problem in the soldering step (at about 250° C.) and in the mold sealing step (at about 180° C.). It is, therefore, preferable that the warpage be equal to or smaller than 230 μm. From the analysis results, it was found that the absolute value of the warpage of the heat sink 2 due to heat is equal to or smaller than 230 μm when the thickness of the electroconductive member 5 is larger than 1.15 times the thickness of the heat sink 2 and not larger than 1.45 times the thickness of the heat sink 2.

Further, if the thickness of the electroconductive member 5 set to 1.2 to 1.4 times the thickness of the heat sink 2, the warpage can be limited to about 120 μm or less. Therefore, this setting is more preferable. The major reason that the thickness ratio at which the warpage is reduced is higher than 1 is that the electroconductive member 5 does not occupy the entire upper surface of the insulating member 4, while the heat sink 2 covers (is in intimate contact with) the entire lower surface of the insulating member 4, and that if the thermal expansion coefficients of the heat sink 2 and the electroconductive member 5 are equal to each other (the materials are the same), producing substantially the same stresses in the upper and lower surfaces of the insulating member 4 when the temperature changes requires increasing the electroconductive member 5 in thickness.

The thickness ratio range in which the warpage is reduced does not substantially depend on the shape of the fins 3 (height, diameter). In the 6-in-1 structure, the area of the electroconductive member 5 is ordinarily about 60 to 80% of the area of the heat sink 2. In this area ratio range (60 to 80%), the absolute value of the warpage is reduced with respect to the thickness ratio ranging from 1.2 to 1.4 times and is minimized when the thickness ratio is about 1.3 times.

Figure 9:
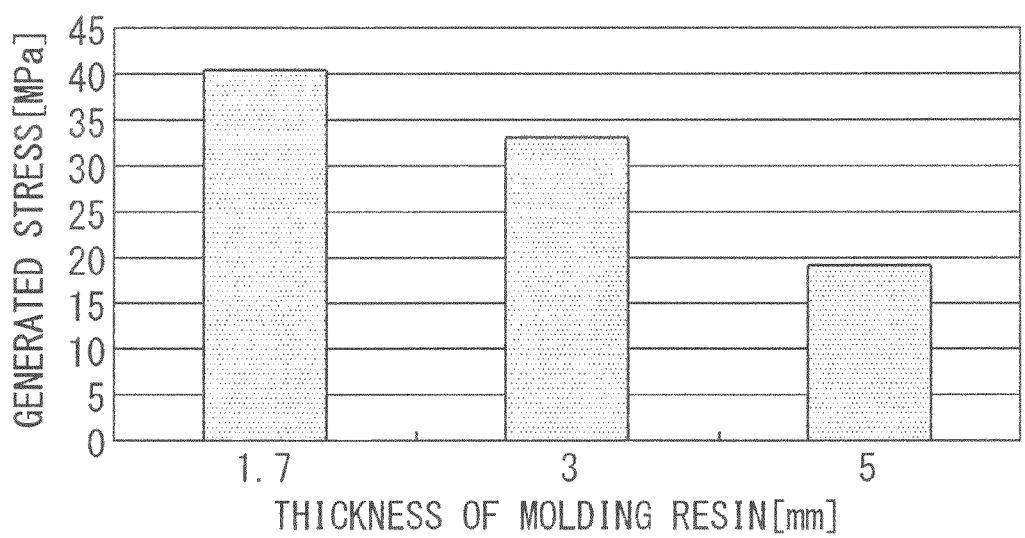
FIG. 9 is a diagram showing the relationship between the thickness of the molding resin and generated stress.

It is necessary to design the thickness and material of the molding resin 10 by considering the resistive strength (stress when a predetermined tension set occurs) against mechanical stress in the heat sink 2. This design is important particularly when a low-resistive-strength material such as Al is selected as the material of the heat sink 2 for the purpose of reducing the weight. For example, in a case where the thickness of the heat sink 2 is 3 mm and the material is Al having a low resistive strength, stress caused proximate the screw fastened portions exceeds the resistive strength to cause plastic deformation as a result of a hydrostatic pressure (0.5 to 1.0 MPa) and a reaction from the sealing material (1.0 to 10.0 N/mm) after water cooling is started while the heat sink 2 is attached to the cooling jacket. In a state where the stress exceeds the resistive strength, there is an apprehension of progress of deformation and occurrence of leakage of water. The deformation of the heat sink 2 can be limited by increasing the thickness of the molding resin 10, thereby reducing the stress concentrated on the peripheries of the screw fastened portions of the heat sink 2. FIG. 9 is a diagram showing the relationship between the thickness of the molding resin and generated stress. It can be understood that if the molding resin 10 is thicker, the generated stress can be reduced.

Embodiment 2

Figure 10:
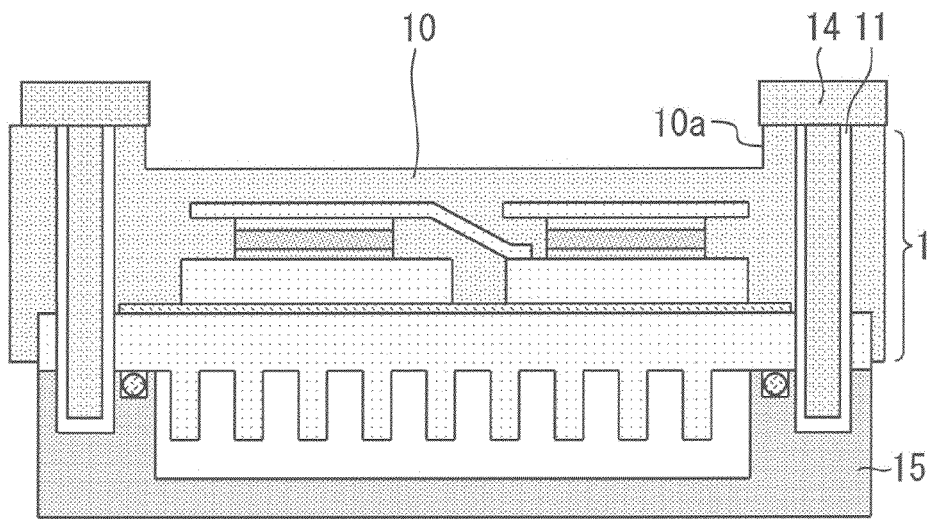
FIGS. 10 and 11 are a sectional view and a top view of a semiconductor module according to Embodiment 2 of the present invention.
Figure 11:
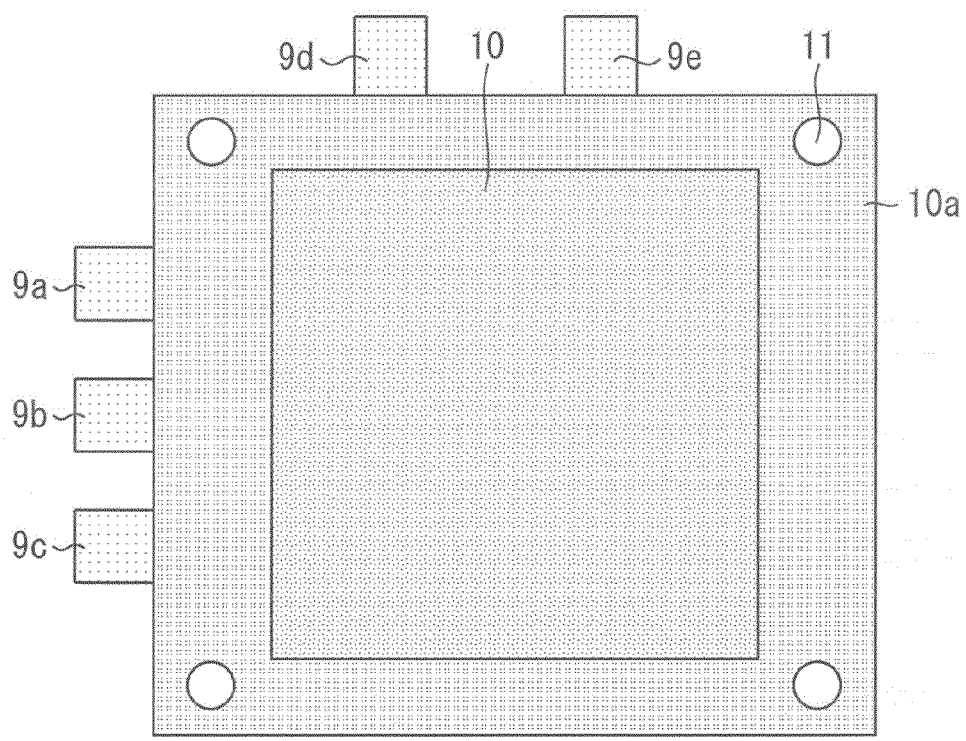

FIGS. 10 and 11 are a sectional view and a top view of a semiconductor module according to Embodiment 2 of the present invention. Stress generated when the semiconductor module 1 is used while being attached to the cooling jacket 15 is increased in the vicinity of each hole 11. In the present embodiment, therefore, a projecting portion 10a projecting upward is provided on a peripheral portion of the molding resin 10, so that the height of the upper surface of the molding resin 10 is increased proximate the holes 11 relative to the height of the upper surface of the molding resin 10 at the central portion of the module. The strength of the module can be increased by increasing the molding resin 10 in thickness proximate the holes 11 where mechanical stress tends to concentrate. Since only part of the molding resin 10 is increased in thickness, the amount of the molding resin 10 can be reduced in comparison with the case where the entire molding resin 10 is increased in thickness.

Embodiment 3

Figure 12:
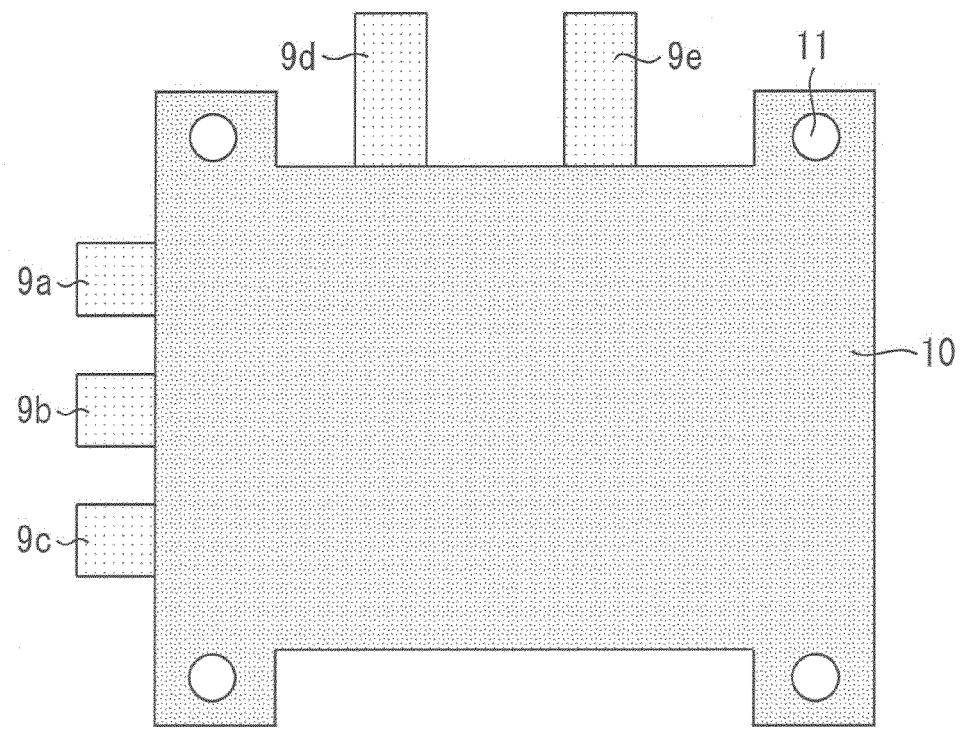
FIGS. 12 and 13 are a top view and an internal view of a semiconductor module according to Embodiment 3 of the present invention.
Figure 13:
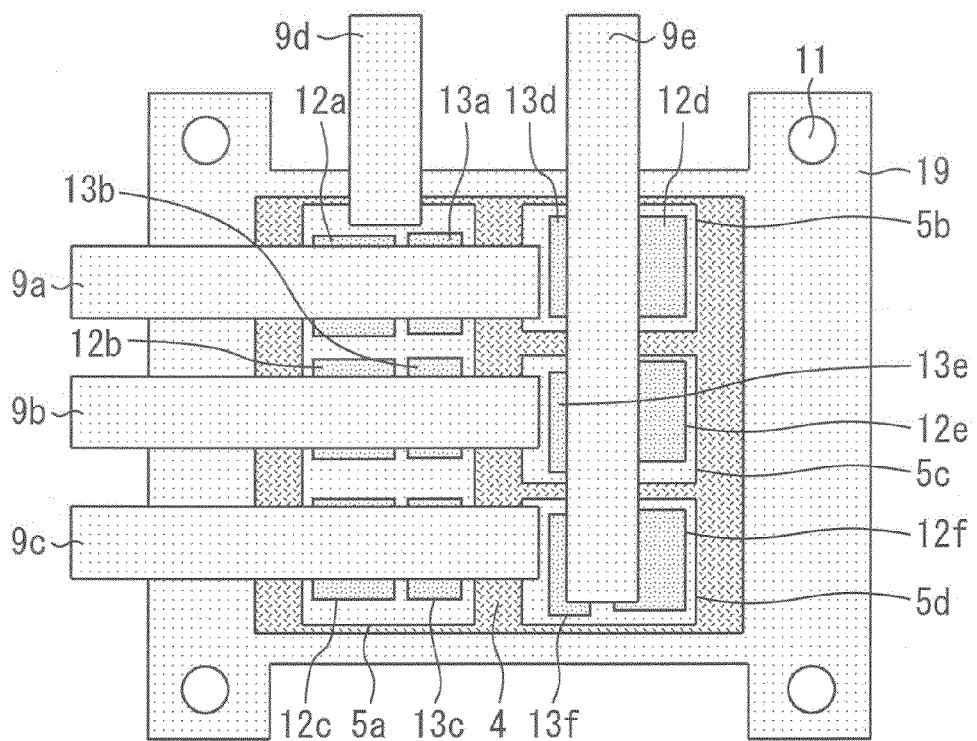

FIGS. 12 and 13 are a top view and an internal view of a semiconductor module according to Embodiment 3 of the present invention. The heat sink 2 has projecting portions 19 projecting outward. The holes 11 are provided in the projecting portions 19. The molding resin 10 is formed into the same shape as that of the heat sink 2. The amounts of the materials of the heat sink 2 and the molding resin 10 can be reduced in this way. The surface area of the semiconductor module can also be reduced by disposing the metal frames 9*d* and 9*e* between the projecting portions 19.

Figure 14:
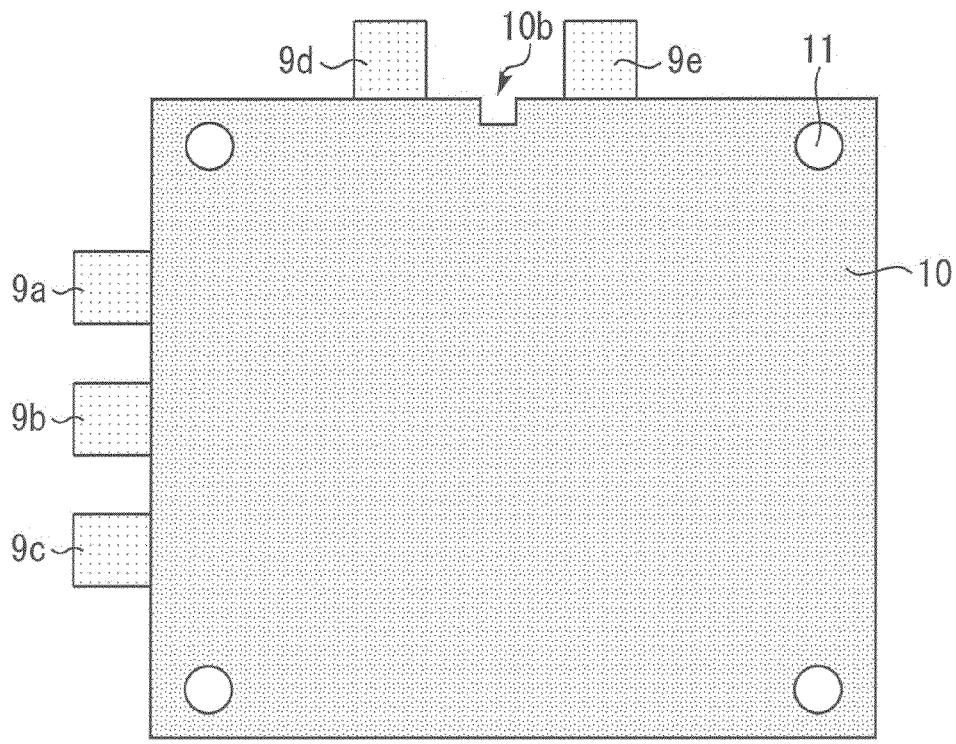
FIG. 14 is a top view of Modified Example 1 of the semiconductor module according to Embodiment 3 of the present invention.
Figure 15:
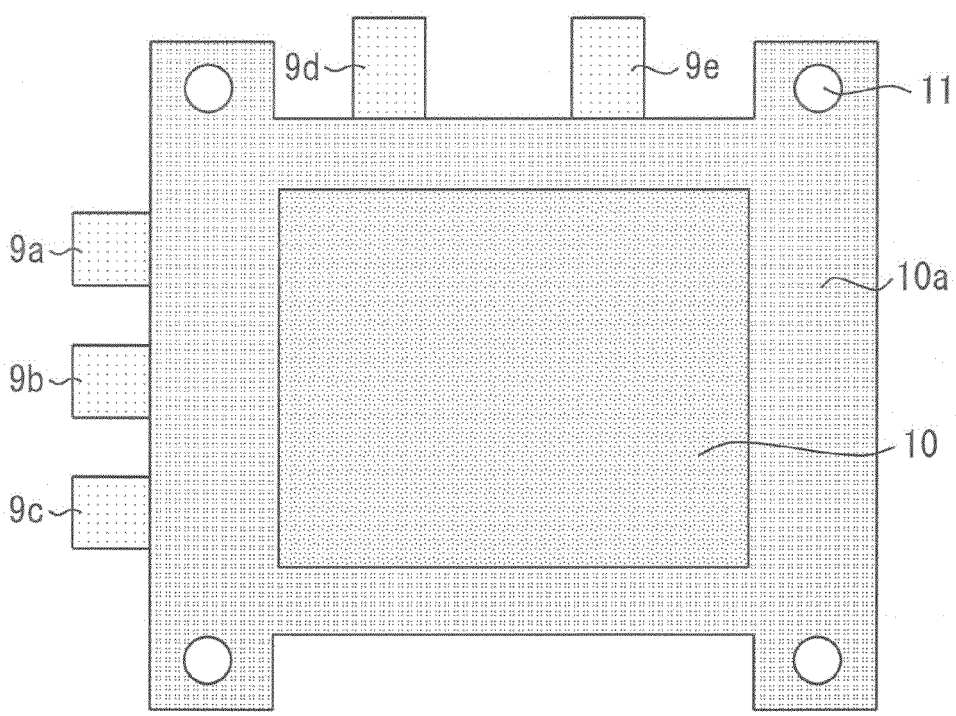
FIG. 15 is a top view of Modified Example 2 of the semiconductor module according to Embodiment 3 of the present invention.

FIG. 14 is a top view of Modified Example 1 of the semiconductor module according to Embodiment 3 of the present invention. The molding resin 10 is formed into a square shape as viewed in plan and a cut 10*b* is provided between the metal frames 9*d* and 9*e*. A creeping distance is obtained on the molding resin 10 in this way, thereby enabling the distance between the metal frames to be reduced. FIG. 15 is a top view of Modified Example 2 of the semiconductor module according to Embodiment 3 of the present invention. Modified Example 2 is a combination of Embodiments 2 and 3 and enables obtaining the effects of Embodiments 2 and 3.

Embodiment 4

Figure 16:
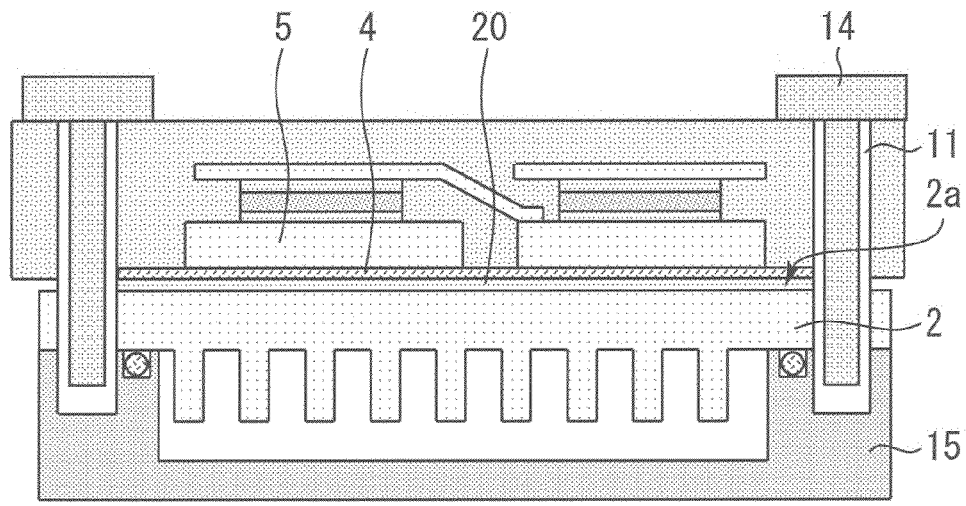
FIG. 16 is a sectional view of a semiconductor module according to Embodiment 4 of the present invention.

FIG. 16 is a sectional view of a semiconductor module according to Embodiment 4 of the present invention. The insulating member 4 having its back surface metalized is joined to the fixation surface 2*a* of the heat sink 2 by means of a joining material 20. The joining material 20 is, for example, solder which is an electroconductive joining material. Use of a material such as solder having good heat conductivity as joining material 20 enables the semiconductor module 1 to stably have heat releasability much higher than that in the case of the conventional art using grease, though the heat releasability is slightly lower than that of the semiconductor module in Embodiment 1.

The heat sink 2 and the insulating member 4 can be prepared separately from each other and can be thereafter joined to each other. The semiconductor module can therefore be reduced in size. Also in a case where the heat sink 2 or the semiconductor chip 6 on the insulating member 4 is replaced after the heat sink 2 is once joined to the insulating member 4, the heat sink 2 can easily be detached and replaced.

The upper surface of the insulating member 4 may be metalized to enable the upper surface of the insulating member 4 and the electroconductive member 5 to be joined by means of a joining material such as solder. Also in such a case, the insulating member 4 and the electroconductive member 5 can be prepared separately from each other and can be thereafter joined to each other.

Embodiment 5

Figure 17:
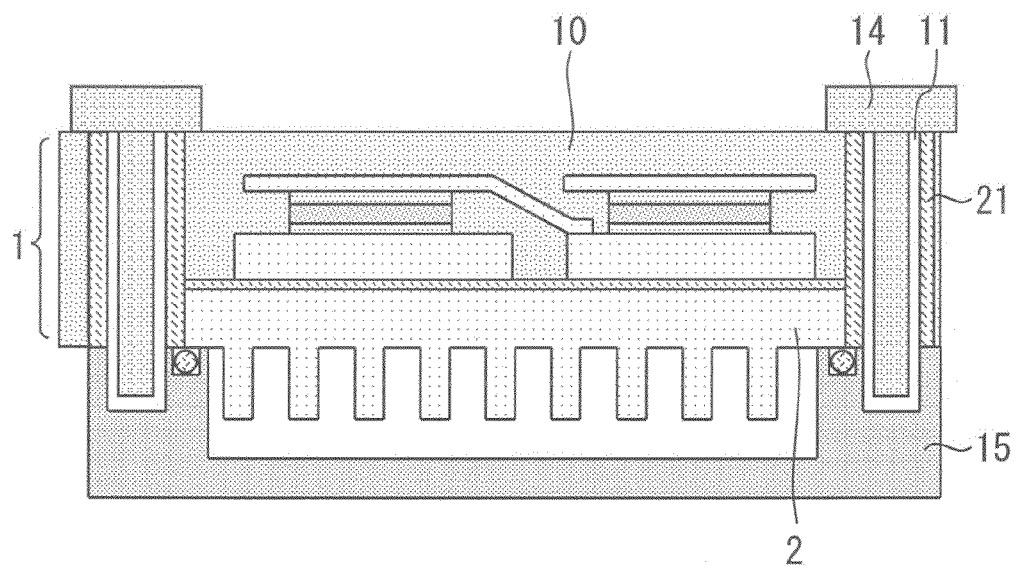
FIGS. 17 and 18 are a sectional view and a top view of a semiconductor module according to Embodiment 5 of the present invention.
Figure 18:
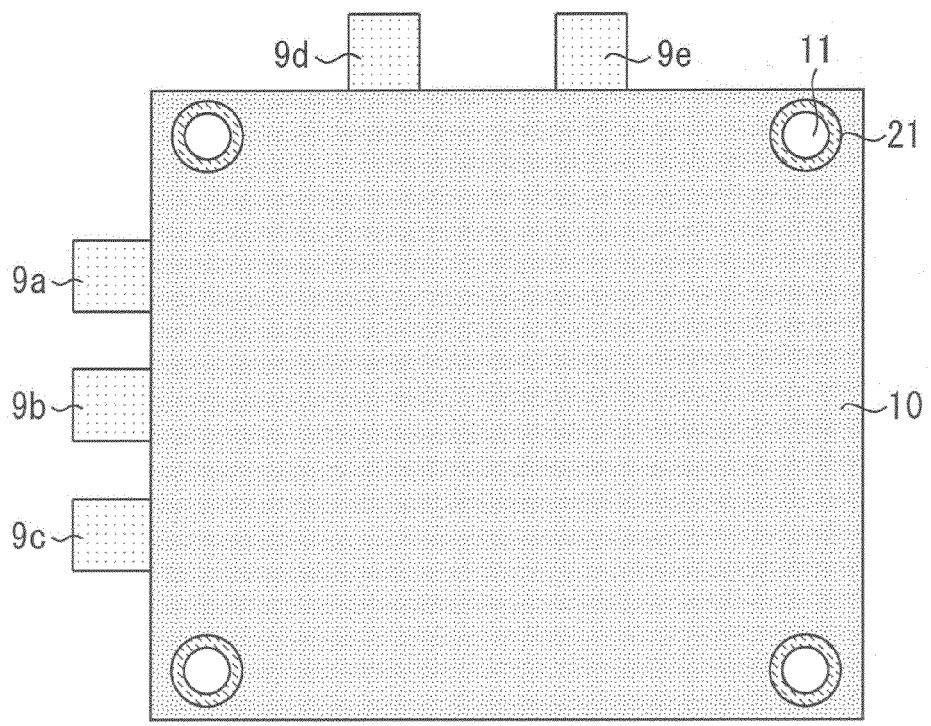

FIGS. 17 and 18 are a sectional view and a top view of a semiconductor module according to Embodiment 5 of the present invention. A collar 21 formed of a material (such as Fe) having a resistive strength higher than that of the heat sink 2 is inserted in each hole 11 in the molding resin 10. Because the reaction caused by fastening with the screw 14 is received by the collar 21 having a high resistive strength, deformation of the heat sink 2 and the molding resin 10 around the hole 11 can be inhibited.

If the collar 21 is extended to the lower surface of the heat sink 2, deformation of the heat sink 2 can also be inhibited to further hold axial force. It is preferable that at least one projection/recess be provided in the outer side surface of the collar 21 (for example, by knurling). The intimate contact between the molding resin 10 and the collar 21 can thereby be improved to inhibit separation therebetween.

Embodiment 6

Figure 19:
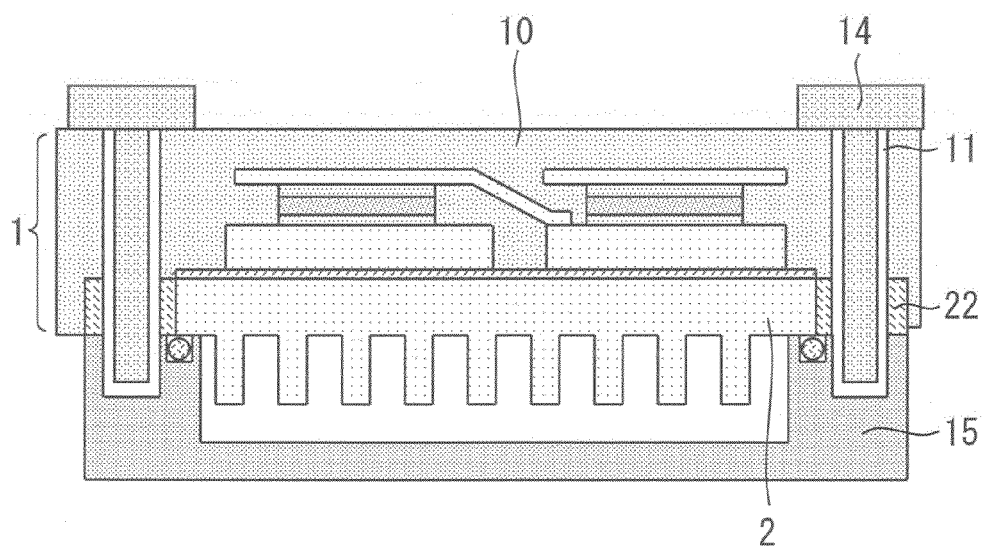
FIGS. 19 and 20 are a sectional view and a top view of a semiconductor module according to Embodiment 6 of the present invention.
Figure 20:
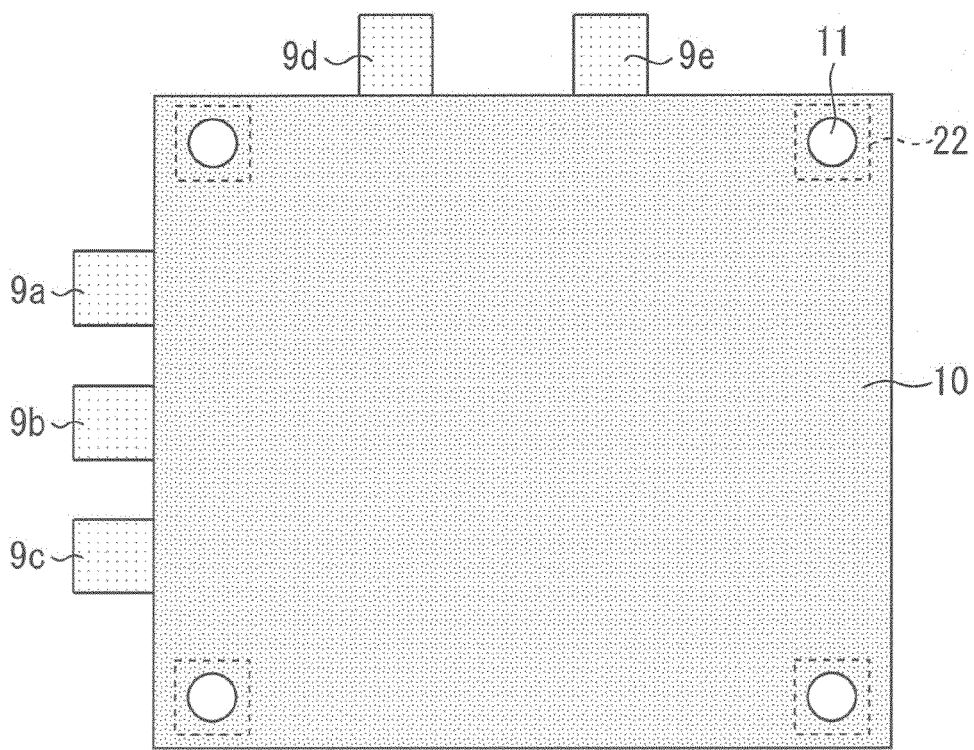

FIGS. 19 and 20 are a sectional view and a top view of a semiconductor module according to Embodiment 6 of the present invention. A plate member 22 formed of a material (such as Fe) having a resistive strength higher than that of the heat sink 2 is provided around each hole 11 in the heat sink 2. Deformation of the heat sink 2 around the hole 11 under fastening with the screw 14 can thereby be inhibited. The warpage of the entire module can therefore be inhibited to secure sealing to the cooling jacket 15.

Also, the surface of the plate member 22 may be knurled. Bondability to the heat sink 2 can thereby be secured. Further, it is preferable to alloy the heat sink 2 and the plate member 22 at the interface therebetween by selecting a material which can be diffused into the heat sink 2 as the material of the plate member 22. The characteristics of the heat sink 2 including heat conductivity and resistive strength can be partially changed locally in this way. For example, if the material of the heat sink 2 is Al, Fe is selected as the material of the plate member 22.

Embodiment 7

Figure 21:
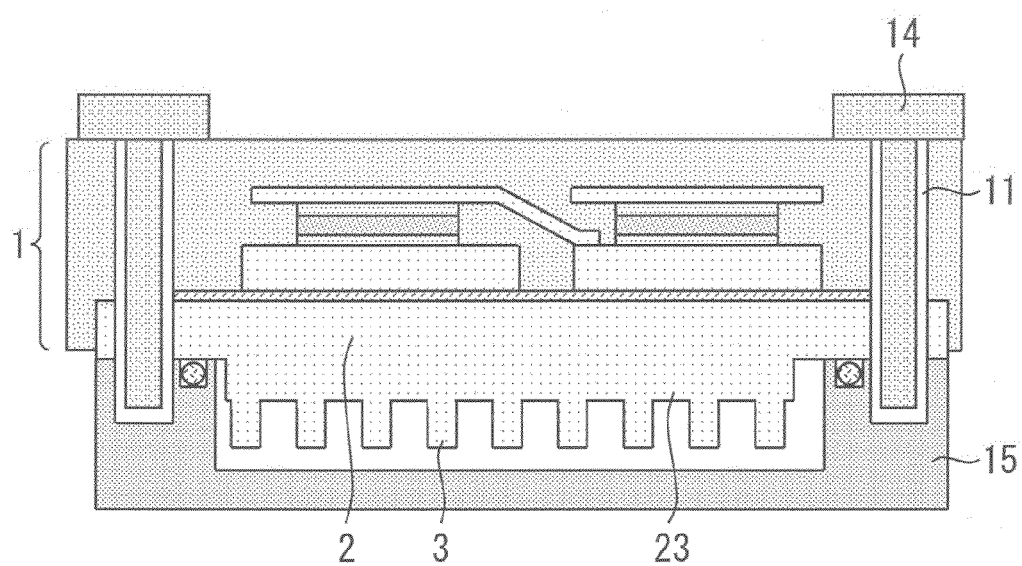
FIG. 21 is a sectional view of a semiconductor module according to Embodiment 7 of the present invention.

FIG. 21 is a sectional view of a semiconductor module according to Embodiment 7 of the present invention. A stepped portion 23 is provided in the heat release surface 2*b* of the heat sink 2 such that a central portion is projecting, thereby enabling the cooling medium to easily contact with proximal end portions of the fins 3 so that the heat release performance is improved. Further, because of the increase in thickness of the heat sink 2 corresponding to the height of the stepped portion 23, the strength of the module is increased.

Embodiment 8

Figure 22:
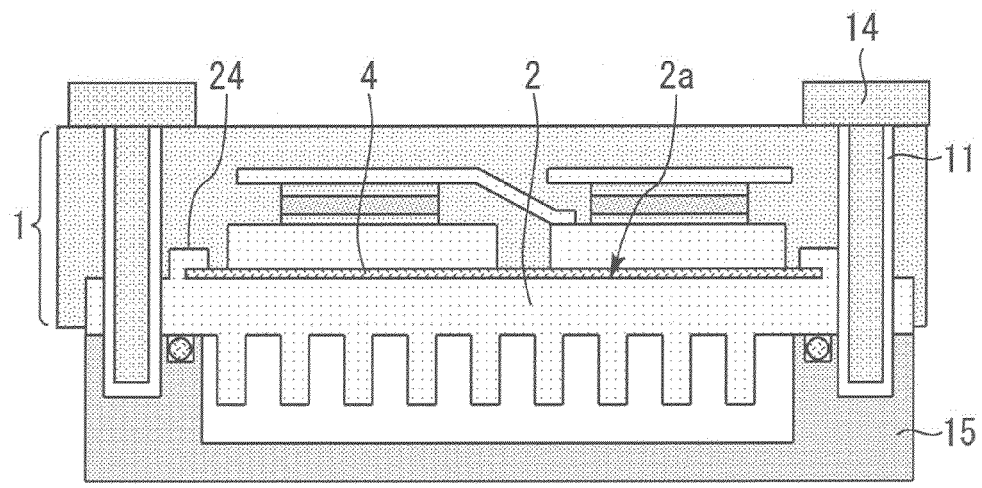
FIGS. 22 and 23 are a sectional view and an internal view of a semiconductor module according to Embodiment 8 of the present invention.
Figure 23:
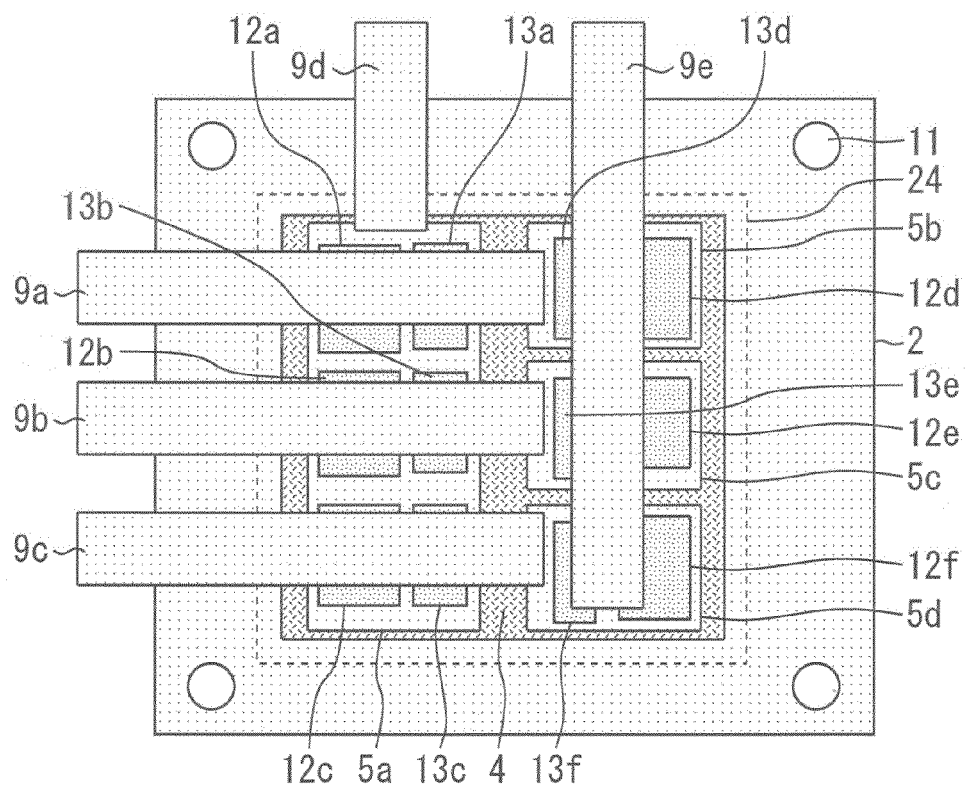

FIGS. 22 and 23 are a sectional view and an internal view of a semiconductor module according to Embodiment 8 of the present invention. A guide 24 is provided on a peripheral portion of the fixation surface 2*a* of the heat sink 2. The guide 24 fixes an end portion of the insulating member 4, thereby enabling the insulating member 4 to function as a frame member. The strength of the heat sink 2 can thereby be increased.

Figure 24:
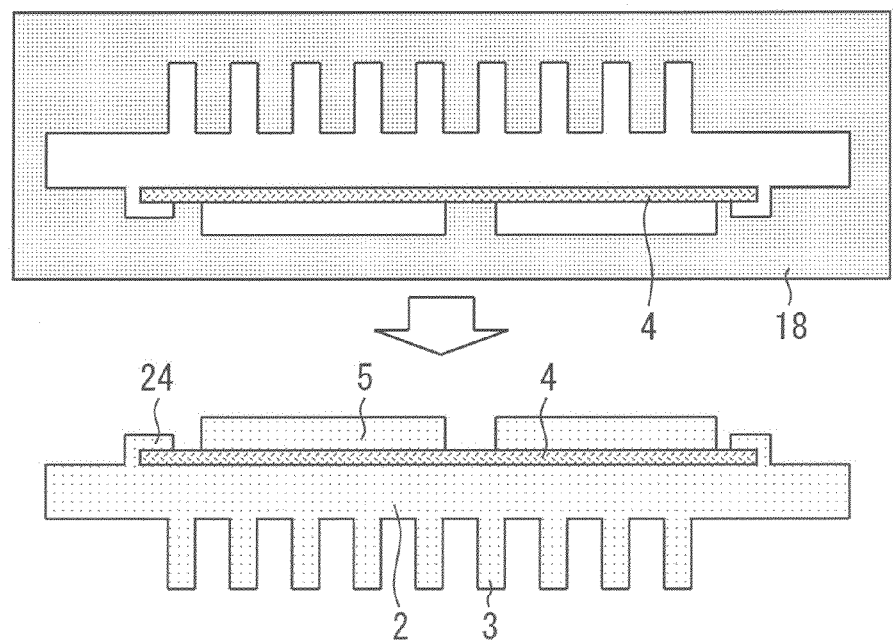
FIG. 24 is a sectional view showing a method of manufacturing the metal pattern and the heat sink of the semiconductor module shown in FIG. 22.

FIG. 24 is a sectional view showing a method of manufacturing the metal pattern and the heat sink of the semiconductor module shown in FIG. 22. A molten metal is flowed into a mold 18 while the insulating member 4 is held in the mold 18, thus enabling the heat sink 2, the electroconductive member 5 and the guide 24 to be manufactured simultaneously with each other.

Embodiment 9

Figure 25:
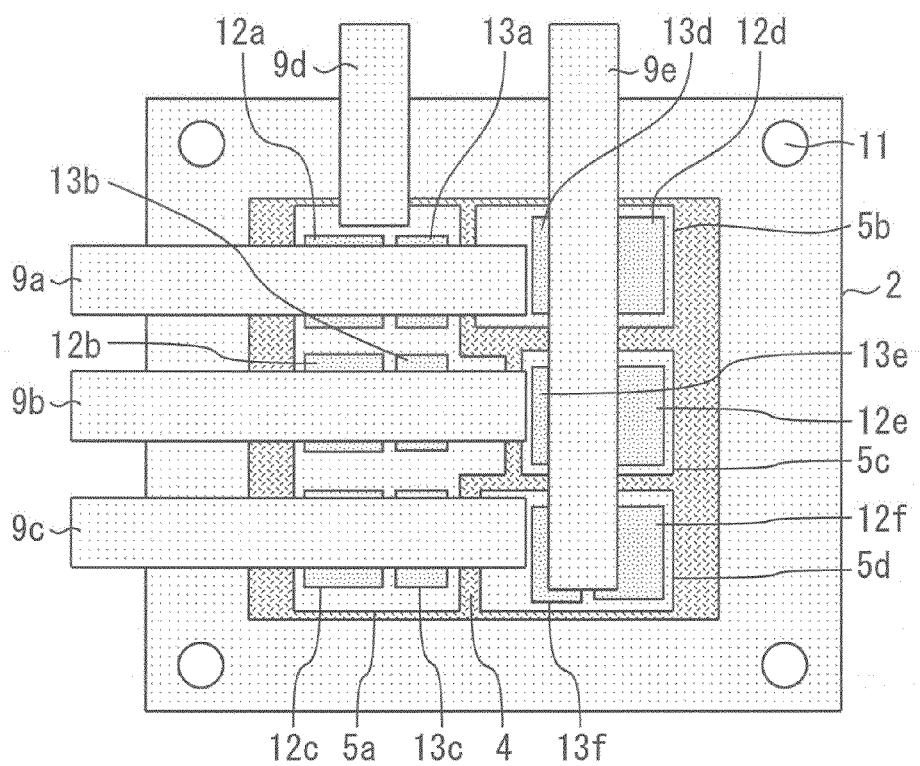
FIG. 25 is an internal view of a semiconductor module according to Embodiment 9 of the present invention.

FIG. 25 is an internal view of a semiconductor module according to Embodiment 9 of the present invention. Electroconductive members 5 are provided in interdigital form as viewed in plan, such that the non-pattern portion of the upper surface of the insulating member 4 where the electroconductive members 5 are not provided meanders. As a result, the strength against bending is increased in comparison with the module in which the non-pattern portion is straight.

Embodiment 10

Figure 26:
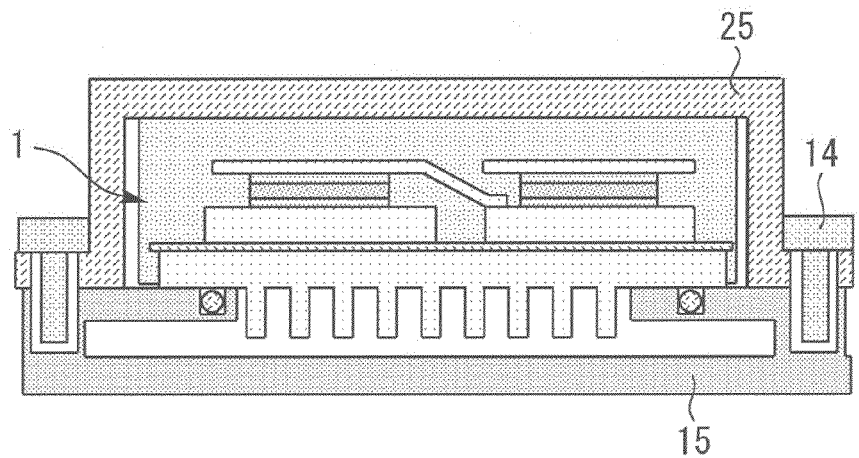
FIGS. 26 and 27 are a sectional view and a top view of a semiconductor device according to Embodiment 10 of the present invention.
Figure 27:
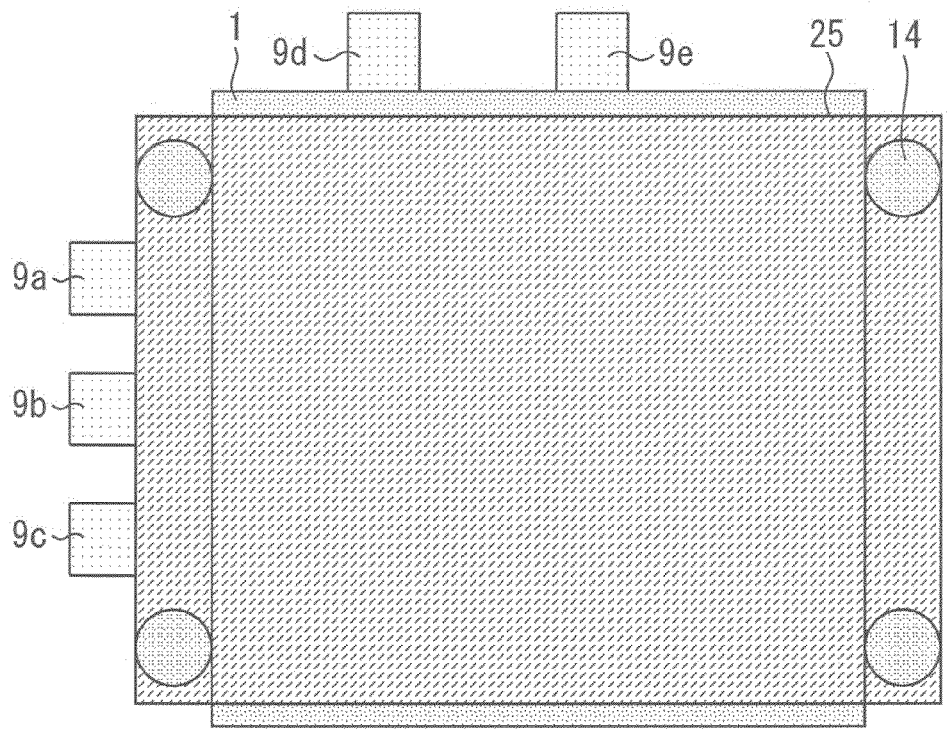

FIGS. 26 and 27 are a sectional view and a top view of a semiconductor device according to Embodiment 10 of the present invention. The semiconductor module 1 is fixed on the cooling jacket 15 by being pressed with a plate member 25 externally attached. The plate member 25 is brought into contact with the semiconductor module 1 and attached to the cooling jacket 15 with screws 14. A material having a high resistive strength and a low magnetic permeability (e.g., Cu) is preferred as the material of the plate member 25.

Warpage of the semiconductor module 1 can be inhibited by pressing with the plate member 25 having a high resistive strength, thus maintaining sealing to the cooling jacket 15. Since a material having a high resistive strength can be used for portions fastened with the screws 14, deformation of the semiconductor module 1 can be inhibited. Also, use of a material having a low magnetic permeability enables preventing a magnetic field generated when a current flows through the semiconductor chip 6 from being diffused to the outside. The normal operation with no influence of a magnetic field can thereby be ensured even if a control circuit board or the like is placed on the plate member 25.

DESCRIPTION OF SYMBOLS 1 semiconductor module, 2 heat sink, 2a fixation surface, 2b heat release surface, 3 fin, 4 insulating member, 5 electroconductive member, 6 semiconductor chip, 9 metal frame, 10 molding resin, 11 hole, 14 screw, 15 cooling jacket, 19 projecting portion, 21 collar, 22 plate member, 24 guide, 25 plate member

The invention claimed is:

1. A semiconductor module comprising:
a heat sink having a fixation surface and a heat release surface opposite from the fixation surface;
a fin provided in a central portion of the heat release surface;
an insulating member provided on the fixation surface of the heat sink;
an electroconductive member provided on the insulating member;
a semiconductor chip provided on the electroconductive member;
a metal frame connected to the semiconductor chip; and
a molding resin covering the heat sink, the insulating member, the electroconductive member, the semiconductor chip, and the metal frame so that the fin is exposed to outside,
wherein a hole extends through a peripheral portion of the heat sink and a peripheral portion of the molding resin, and
the semiconductor module is mounted on a cooling jacket by passing a screw through the hole.

2. The semiconductor module of claim 1, wherein height of an upper surface of the molding resin proximate the hole is higher than height of an upper surface of the molding resin at a central portion of the module.

3. The semiconductor module of claim 1, wherein the heat sink has a projecting portion projecting outward, and the hole is provided in the projecting portion.

4. The semiconductor module of claim 3, wherein the molding resin is formed into a square shape as viewed in plan.

5. The semiconductor module of claim 1, further comprising a collar formed of a material having a resistive strength higher than that of the heat sink and inserted in the hole of the molding resin.

6. The semiconductor module of claim 5, wherein a projection and a recess are provided in an outer side surface of the collar.

7. The semiconductor module of claim 1, further comprising a plate member formed of a material having a resistive strength higher than that of the heat sink and provided around the hole of the heat sink.

8. The semiconductor module of claim 7, wherein the heat sink and the plate member are alloyed at an interface therebetween.

9. The semiconductor module of claim 1, wherein a stepped portion is provided in the heat release surface.

10. The semiconductor module of claim 1, wherein the heat sink includes a guide provided on a peripheral portion of the fixation surface, and the guide fixes an end portion of the insulating member.

11. The semiconductor module of claim 1, wherein the electroconductive member is provided in interdigital form as viewed in plan.

12. The semiconductor module of claim 1, wherein the insulating member is an insulating substrate.

13. The semiconductor module of claim 12, wherein the insulating substrate is made of a ceramic material.

14. The semiconductor module of claim 1, wherein the insulating member is a resin in sheet form.

15. The semiconductor module of claim 1, wherein a plating treatment is performed on a region of a surface of the electroconductive member on which the semiconductor chip is to be mounted, and the electroconductive member and the semiconductor chip are joined to each other by a electroconductive joining material.

16. The semiconductor module of claim 1, wherein a material of the heat sink is the same as a material of the electroconductive member.

17. The semiconductor module of claim 16, wherein the material of the heat sink and the electroconductive member is Al or an Al alloy.

18. The semiconductor module of claim 1, wherein a thickness of the electroconductive member is larger than 1.15 times a thickness of the heat sink and not larger than 1.45 times the thickness of the heat sink.

19. The semiconductor module of claim 1, wherein the semiconductor chip includes a plurality of switching elements composing an inverter.

20. A semiconductor device comprising:
a semiconductor module; and
a plate member pressing and fixing the semiconductor module on a cooling jacket,
wherein the semiconductor module includes:
a heat sink having a fixation surface and a heat release surface opposite from the fixation surface;
a fin provided in a central portion of the heat release surface;
an insulating member provided on the fixation surface of the heat sink;
an electroconductive member provided on the insulating member;
a semiconductor chip provided on the electroconductive member;
a metal frame connected to the semiconductor chip; and
a molding resin covering the heat sink, the insulating member, the electroconductive member, the semiconductor chip, and the metal frame so that the fin is exposed to outside.

* * * * *